(12) United States Patent
Phan et al.

(10) Patent No.: US 11,632,857 B2
(45) Date of Patent: Apr. 18, 2023

(54) SETTING THE IMPEDANCE OF SIGNAL TRACES OF A CIRCUIT BOARD USING A REFERENCE TRACE

(71) Applicant: SUPER MICRO COMPUTER, INC., San Jose, CA (US)

(72) Inventors: Manhtien V. Phan, Morgan Hill, CA (US); Mau-Lin Chou, Milpitas, CA (US); Chih-Hao Lee, New Taipei (TW)

(73) Assignee: SUPER MICRO COMPUTER, INC., San Jose, CA (US)

( * ) Notice: Subject to any disclaimer, the term of this patent is extended or adjusted under 35 U.S.C. 154(b) by 46 days.

(21) Appl. No.: 17/480,696

(22) Filed: Sep. 21, 2021

(65) Prior Publication Data

US 2022/0007501 A1 Jan. 6, 2022

Related U.S. Application Data

(60) Division of application No. 17/070,167, filed on Oct. 14, 2020, now Pat. No. 11,166,367, which is a continuation of application No. 16/750,686, filed on Jan. 23, 2020, now Pat. No. 10,849,220.

(51) Int. Cl.
  *H01L 23/66* (2006.01)
  *H01L 23/528* (2006.01)
  *H05K 1/02* (2006.01)

(52) U.S. Cl.
  CPC ......... *H05K 1/0253* (2013.01); *H05K 1/0298* (2013.01); *H05K 2201/093* (2013.01)

(58) Field of Classification Search
  CPC .... H05K 1/024; H05K 1/0213; H05K 1/0218; H05K 1/0219; H05K 1/0221; H05K 1/0222; H05K 1/0224; H05K 1/0228; H05K 1/0243; H05K 1/0251; H05K 1/0253; H05K 1/0298; H05K 1/117; H05K 1/186; H05K 1/187; H05K 2201/093; H05K 2201/0376; H05K 2201/0715; H05K 2201/1034; H01L 23/66; H01L 23/528; H01L 23/5222; H01L 23/5381; H01L 23/5383; H01L 23/5384
  USPC ........ 174/261, 255, 260; 361/761, 777, 780, 361/794; 257/508, 659, 728, 730, 762
  See application file for complete search history.

(56) References Cited

U.S. PATENT DOCUMENTS

| | | | | |
|---|---|---|---|---|
| 7,405,477 B1* | 7/2008 | Tao | ...................... | H05K 1/0243 257/730 |
| 7,755,445 B2* | 7/2010 | Dutta | ...................... | H01P 3/084 333/1 |
| 2003/0077924 A1* | 4/2003 | Shirasaki | ................ | H01L 23/66 439/68 |
| 2003/0173640 A1* | 9/2003 | Ando | ...................... | H01L 23/66 257/508 |
| 2004/0211590 A1* | 10/2004 | Tagi | ...................... | H05K 1/0218 361/780 |
| 2010/0052993 A1* | 3/2010 | Kim | ...................... | H01P 11/003 343/700 MS |

(Continued)

*Primary Examiner* — Xiaoliang Chen
(74) *Attorney, Agent, or Firm* — Beyer Law Group LLP

(57) ABSTRACT

A circuit board has an edge connector with signal traces. The signal traces are formed on a dielectric layer of the circuit board. A reference trace is formed within the dielectric layer or on another surface of the dielectric layer. Parameters of the reference trace are adjusted to set an impedance of a single-ended signal trace or a differential impedance of two adjacent signal traces.

7 Claims, 14 Drawing Sheets

(56) References Cited

U.S. PATENT DOCUMENTS

| | | | |
|---|---|---|---|
| 2011/0143687 A1* | 6/2011 | Hiramatsu | H01P 3/085 333/32 |
| 2014/0071646 A1* | 3/2014 | Qian | H05K 3/4644 174/250 |
| 2014/0117552 A1* | 5/2014 | Qian | H01L 23/5383 257/E23.141 |
| 2020/0212610 A1* | 7/2020 | Lee | H05K 1/0253 |

* cited by examiner

SETTING THE IMPEDANCE OF SIGNAL TRACES OF A CIRCUIT BOARD USING A REFERENCE TRACE

CROSS-REFERENCE TO RELATED APPLICATIONS

The present application is a divisional of U.S. application Ser. No. 17/070,167, filed on Oct. 14, 2020, now U.S. Pat. No. 11,166,367 B2, which is a continuation of U.S. application Ser. No. 16/750,686, filed on Jan. 23, 2020, now U.S. Pat. No. 10,849,220 B1. The just-mentioned related applications are incorporated herein by reference in their entirety.

BACKGROUND OF THE INVENTION

1. Field of the Invention

The present invention relates generally to circuit boards.

2. Description of the Background Art

Components of electrical circuits may be mounted on a circuit board, such as a printed circuit board (PCB). Generally speaking, a PCB has a substrate comprising metal and dielectric layers. The metal layers include signal traces that electrically connect two or more points on the PCB and a reference plane that provides a reference, such as a ground reference.

FIG. 1 is a cross-sectional view of a conventional PCB 104. The PCB 104 includes a plurality of signal traces 101, a dielectric layer 103, and a reference plane 102. The signal traces 101 and the reference plane 102 comprise a metal. The signal traces 101 are on one surface of the dielectric layer 103, and the reference plane 102 is on the opposing surface of the dielectric layer 103. The distance between the signal traces 101 and the reference plane 102 is set by the thickness H of the dielectric layer 103.

A differential impedance is the impedance presented by two signal traces 101 to a differential signal propagating on the two signal traces 101. Traditionally, the differential impedance is set by adjusting the width W of the signal traces 101, the thickness T of the signal traces 101, the separation distance S between the signal traces 101, and/or the thickness H of the dielectric layer 103. Embodiments of the present invention allow for setting of differential or single-ended impedance when one or more of these parameters are not readily adjustable.

SUMMARY

In one embodiment, an impedance of one or more signal traces of a circuit board is set by forming a first signal trace on a first surface of a dielectric layer of the circuit board. A reference plane is formed on a second surface of the dielectric layer. A reference trace is formed within the dielectric layer. The impedance of the first signal trace or differential impedance of the first signal trace and a second signal trace may be set by adjusting one or more parameters of the reference trace.

In another embodiment, a circuit board comprises a dielectric layer; a first signal trace and a second signal trace formed on a first surface of the dielectric layer on an edge connector of the circuit board; a reference plane formed on a second surface of the dielectric layer; and a reference trace formed within the dielectric layer and between the reference plane and the first and second signal traces, the reference trace being configured to set a target differential impedance of the first and second signal traces.

In yet another embodiment, an impedance of one or more signal traces of a circuit board is set by forming a first signal trace on a first surface of a dielectric layer of the circuit board. A reference trace is formed on a second surface of the dielectric layer. The impedance of the first signal trace or differential impedance of the first signal trace and a second signal trace may be set by adjusting one or more parameters of the reference trace.

These and other features of the present invention will be readily apparent to persons of ordinary skill in the art upon reading the entirety of this disclosure, which includes the accompanying drawings and claims.

The use of the same reference label in different drawings indicates the same or like components. The drawings are not necessarily to scale.

DETAILED DESCRIPTION

In the present disclosure, numerous specific details are provided, such as examples of apparatus, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
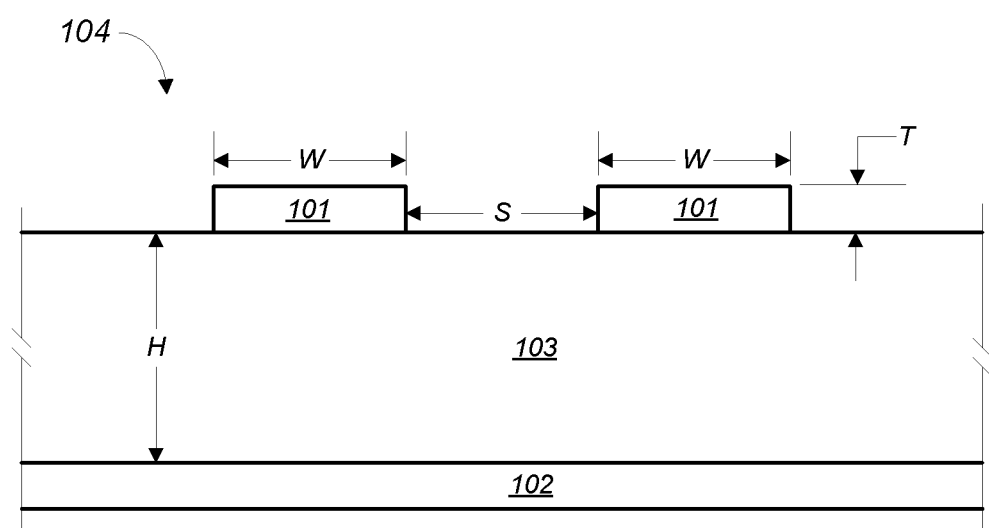
FIG. 1 is a cross-sectional view of a conventional PCB.
Figure 2:
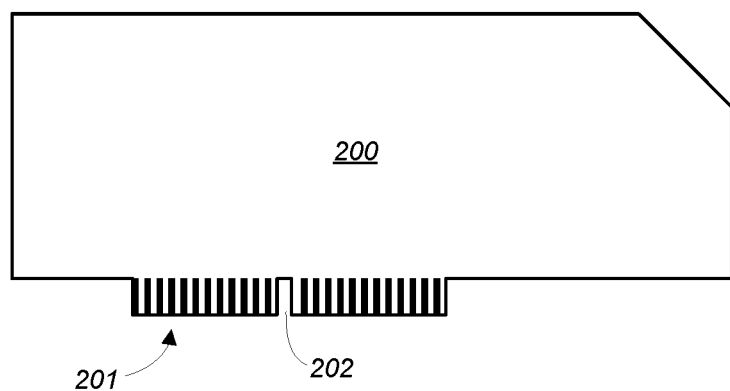
FIG. 2 is a side view of a PCB in accordance with an embodiment of the present invention.

FIG. 2 is a side view of a PCB 200 in accordance with an embodiment of the present invention. The PCB 200 includes a connector 201, which protrudes from a bottom edge of the PCB 200. As its name indicates, the connector 201 allows the PCB 200 to be removably connected to another circuit board, such as a motherboard or a backplane. In the example of FIG. 2, the connector 201 is an edge connector that is removably inserted into a slot (not shown) of the other circuit board. The connector 201 comprises a plurality of signal traces 203 (shown in FIG. 3), which in the example of FIG. 2 are contact fingers that contact corresponding pins of the slot. The connector 201 may include one or more notches 202. A notch 202 prevents incorrect insertion of the connector 201 into the slot.

Figure 3:
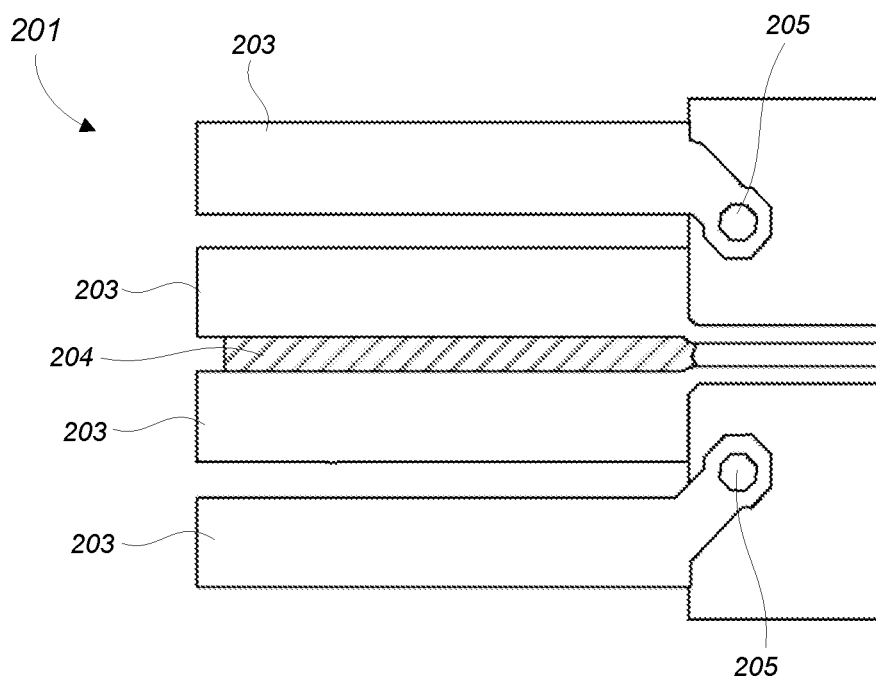
FIG. 3 is a zoom-in view of a connector of the PCB of FIG. 2 in accordance with an embodiment of the present invention.

FIG. 3 is a zoom-in view of the connector 201 in accordance with an embodiment of the present invention. In the example of FIG. 3, a reference trace 204 is formed directly below adjacent signal traces 203, which are referred to herein as "differential signal traces" in that they are configured to carry a differential signal.

The reference trace 204 is visible in FIG. 3 for illustration purposes only. In practice, the reference trace 204 is not readily visible because the reference trace 204 is within a dielectric layer 211 (shown in FIG. 4) of the PCB 200. The signal traces 203 interconnect points on the PCB 200 and electrical components, such as integrated circuits, resistors, capacitors, etc., mounted on the PCB 200. The PCB 200 may include one or more vias 205 to allow the signal traces 203 to be routed to other layers of the PCB 200. The signal traces 203 are contact fingers at least in the connector 201 portion of the PCB 200.

Figure 4:
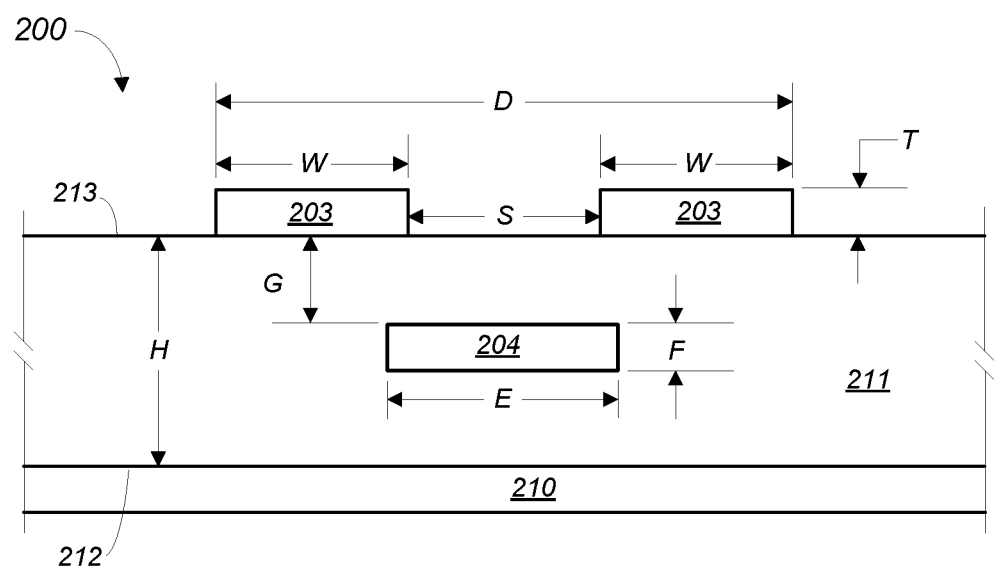
FIG. 4 is a cross-sectional view of the PCB of FIG. 2 in accordance with an embodiment of the present invention.

FIG. 4 is a cross-sectional view of the PCB 200 in accordance with an embodiment of the present invention. In the example of FIG. 4, the PCB 200 comprises a dielectric layer 211 having a surface 213 and an opposing surface 212. The signal traces 203 are formed on the surface 213 and a reference plane 210 is formed on the surface 212. The dielectric layer 211 has a thickness H, which in the example of FIG. 4 is the distance between the signal traces 203 and the reference plane 210. The signal traces 203 and the reference plane 210 comprise a metal. For example, the signal traces 203 and the reference plane 210 may each comprise gold or copper. The PCB 200 may have additional layers depending on the application. For example, the reference plane 210 may be between the dielectric layer 211 and another dielectric layer (not shown).

In one embodiment, the signal traces 203 are contact fingers of a connector that must meet specifications of a standard, such as the Peripheral Component Interconnect (PCI) Express bus standard. Some standards may specify a differential impedance, i.e., the impedance presented by two signal traces to a differential signal propagating on the two signal traces. For example, the PCI Express bus standard requires a target differential impedance of 85 Ohms. A target differential impedance required by a standard may be difficult to meet when the width W of the signal traces 203, the thickness T of the signal traces 203, and/or the thickness H of the dielectric layer 211 cannot be adjusted or has limited adjustability because of electrical or mechanical constraints.

In the example of FIG. 4, the PCB 200 includes a reference trace 204. As is well-known, a "trace" makes an electrical connection between two or more points on a PCB, whereas a "plane" is an uninterrupted area of metal that covers a layer of PCB. Without any electrical component mounted on the PCB 200 and in terms of direct current (DC), the reference trace 204, each signal trace 203, and the reference plane 210 are isolated from each other, i.e., the resistance between them is very high. The differential impedance of differential signal traces 203 may be measured using a time domain reflectometer (TDR).

The reference trace 204 may comprise a metal, such as copper. In one embodiment, the reference trace 204 is formed within the dielectric layer 211, directly under and between two adjacent signal traces 203 that are configured as differential signal traces. The reference trace 204 may have a width E that is narrower than a spanning distance D between outer side perimeters of the differential signal traces 203. The reference trace 204 has a thickness F and is separated from the signal traces 203 by a depth G. The width E, thickness F, depth G, position of the reference trace 204 within the dielectric 211, and/or other parameters of the reference trace 204 may be adjusted to meet a target differential impedance of the signal traces 203. More particularly, given constant/fixed or limited adjustability of the parameters of the signal traces 203, dielectric layer 211, and reference plane 210, the differential impedance of the differential signal traces 203 may be set to meet a target impedance by adjusting one or more parameters of the reference trace 204. The parameters of the reference trace 204 may be set to meet a target impedance by using suitable electromagnetic field simulation software, such as the ANSYS HFSS software, for example.

Figure 5:
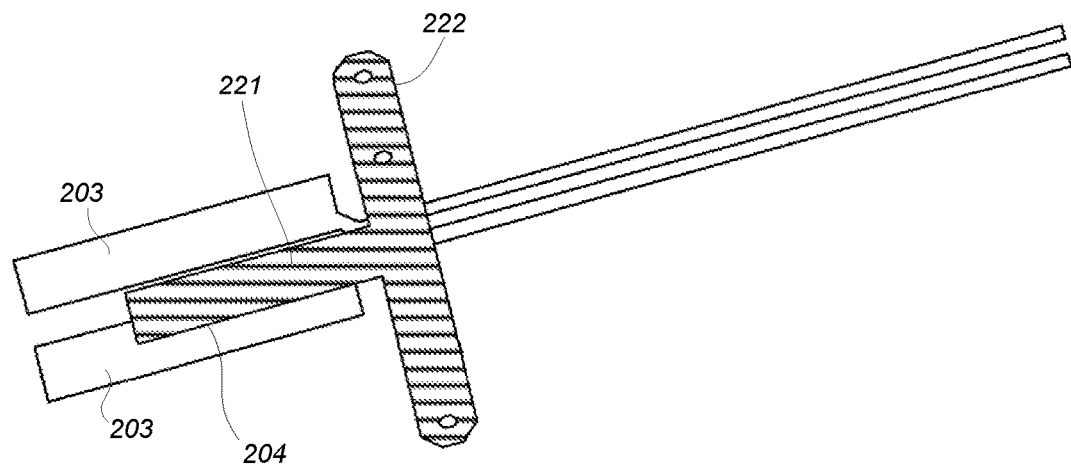
FIGS. 5 and 6 are three-dimensional views that illustrate the orientation of signal traces relative to a reference trace of the PCB of FIG. 2 in accordance with an embodiment of the present invention.
Figure 6:
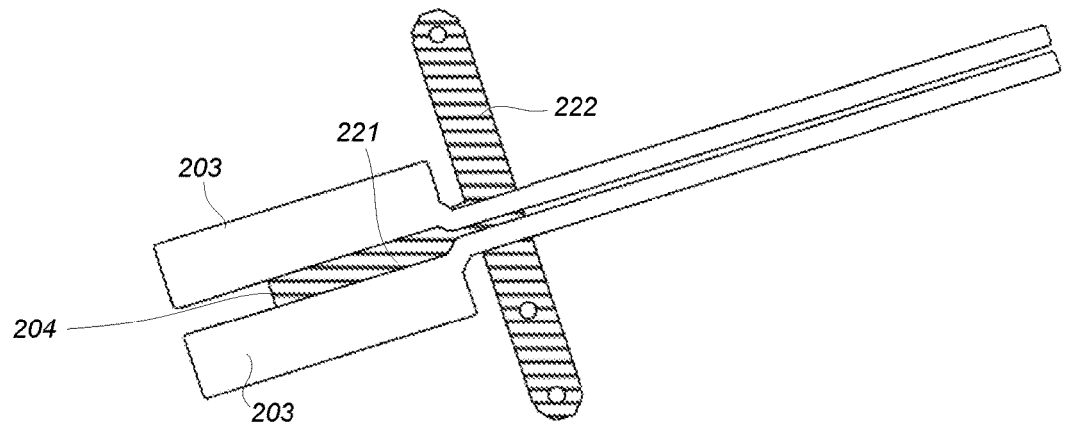

FIGS. 5 and 6 are three-dimensional (3D) views that illustrate the orientation of the differential signal traces 203 relative to the reference trace 204 in accordance with an embodiment of the present invention. FIGS. 5 and 6, which do not show the dielectric layer 211, may be a 3D view of the connector 201 shown in FIG. 3. FIG. 5 is a view from underneath the reference trace 204. As shown in FIG. 5, the reference trace 204 may have a longitudinal portion 221 that is in parallel with the length of at least the contact finger portions of the differential signal traces 203. In the example of FIG. 5, the reference trace 204 has a T-shape, with a portion 222 that is perpendicular to the longitudinal portion 221. FIG. 6 is a view from a top of the signal traces 203.

The inventors performed several case studies that compare the effectiveness of the reference trace 204 compared to other ways of setting the differential impedance of differential signal traces 203 (i.e., two adjacent signal traces 203 that are configured to propagate a differential signal) to meet a target impedance, which is 85 Ohms in the case studies. In the case studies, the dielectric layer 211 that has a total thickness of 63.5 mils and a dielectric constant of 3.0, and each of the differential signal traces 203 has pad size (i.e., size of the contact finger portion) of 28×166 mils as per the PCI Express bus standard. The case studies were performed using the ANSYS HFSS software. These case studies are now explained with reference to FIGS. 7-12.

Figure 7:
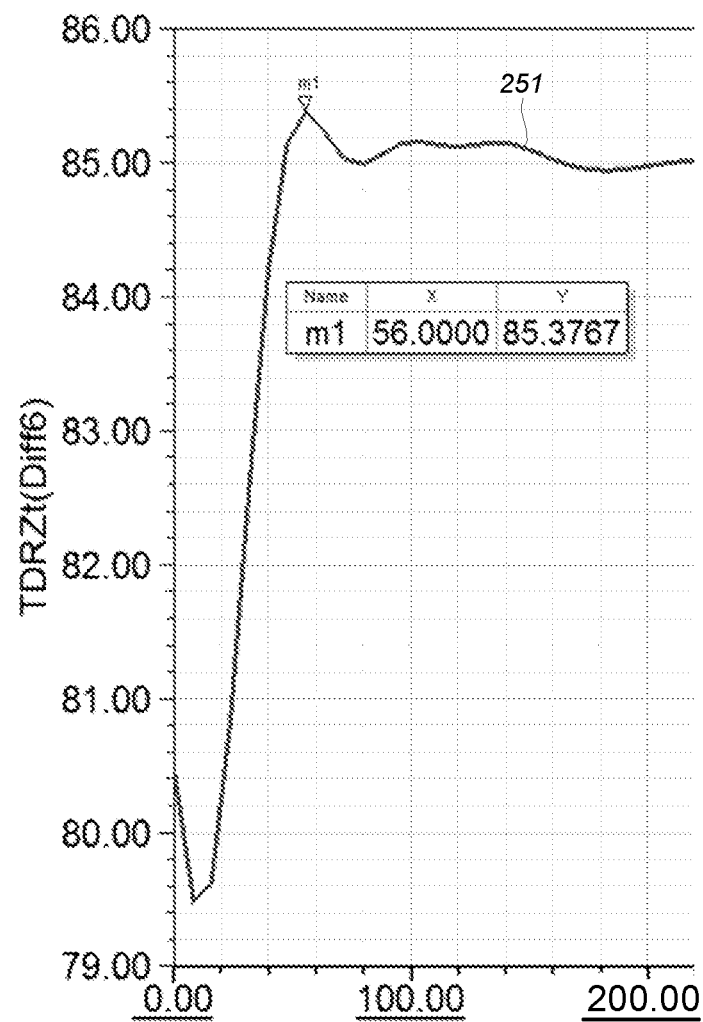
FIG. 7 is a graph of differential impedance in a first case study performed by the inventors.

FIG. 7 is a graph 251 of differential impedance in a first case study performed by the inventors. The graph 251 indicates the differential impedance of differential signal traces 203 employed as contact fingers and with a reference trace 204 as shown in FIG. 3. For the case study of FIG. 7, the reference trace 204 has a depth G (see FIG. 4) of 12.2 mils and a width E of 25 mils. In the example of FIG. 7, the vertical axis indicates differential impedance in Ohms and the horizontal axis indicates time in picoseconds. As shown in FIG. 7, the reference trace 204 allows for a differential impedance of about 85 Ohms, which is the target impedance in this example. The width E of the reference 204 may be adjusted to tune the differential impedance of the signal traces 203.

Figure 8:
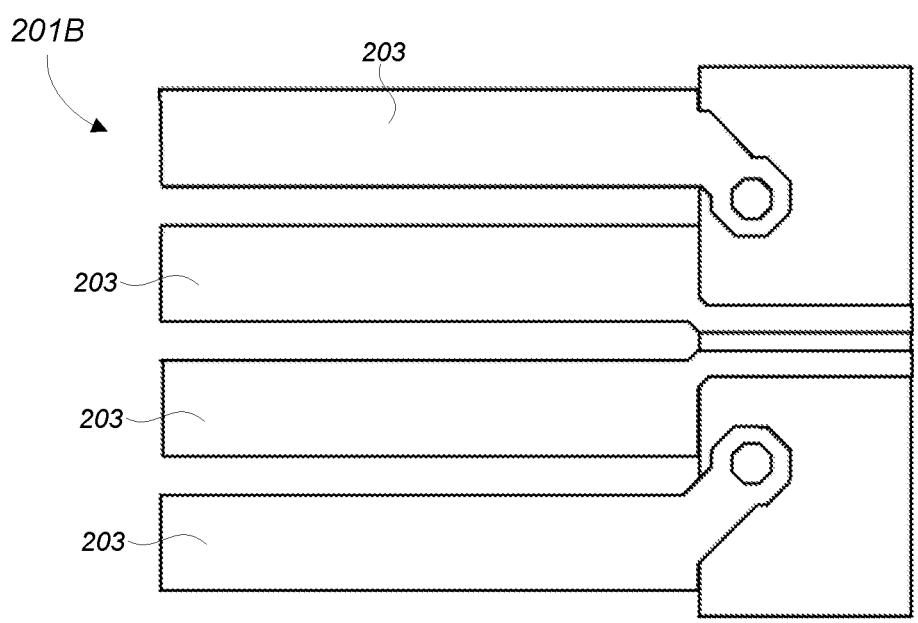
FIG. 8 is a zoom-in view of a connector in a second case study performed by the inventors.

FIG. 8 is a zoom-in view of a connector 201B in a second case study performed by the inventors. The connector 201B is a particular embodiment of the connector 201 of FIG. 3, but without a reference plane 210 and without a reference trace 204. In the second case study, the differential impedance of the differential signal traces 203 is constrained by the thickness H of the dielectric layer 211 and the pad size of the signal traces 203.

Figure 9:
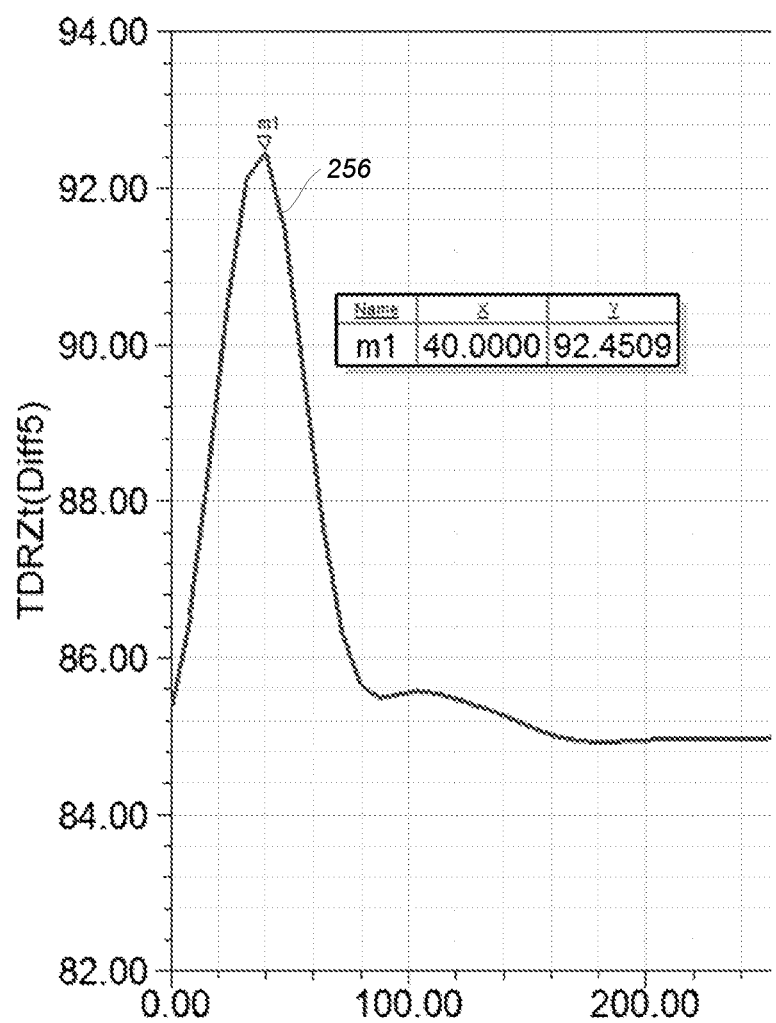
FIG. 9 is a graph of differential impedance in the second case study performed by the inventors.

FIG. 9 is a graph 256 of differential impedance in the second case study. The graph 256 indicates the differential impedance of differential signal traces 203 employed as contact fingers in the connector 201B of FIG. 8. In the example of FIG. 9, the vertical axis indicates differential impedance in Ohms and the horizontal axis indicates time in picoseconds. As shown in FIG. 9, removing the reference plane 210 and the reference trace 204 yields a differential impedance of about 92 Ohms, which is higher than the target impedance of 85 Ohms.

Figure 10:
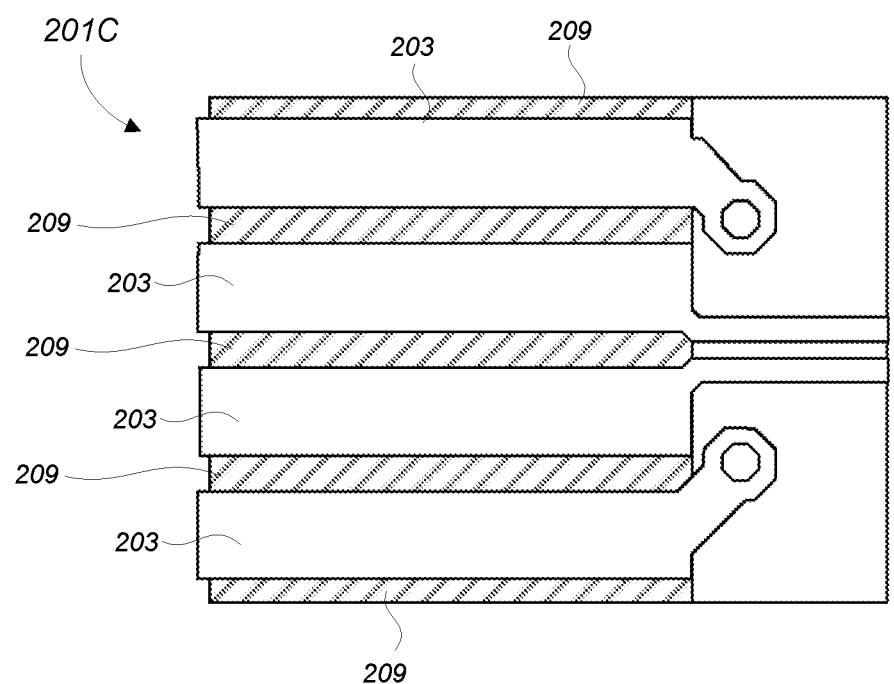
FIG. 10 is a zoom-in view of a connector in a third case study performed by the inventors.

FIG. 10 is a zoom-in view of a connector 201C in a third case study performed by the inventors. The connector 201C is particular embodiment of the connector 201 of FIG. 3, but with the reference trace 204 replaced with a reference plane 209 underneath all of the signal traces 203 of the connector 201. That is, the connector 201C has a reference plane 210 (as in FIG. 4) and a reference plane 209 instead of the reference trace 204. The reference plane 209 is set in the dielectric layer 211 at a depth G of 29.14 mils from the signal traces 203. In the third case study, the differential impedance of differential signal traces 203 is constrained by the limited depth G of the reference plane 209 and the fixed pad size of the signal traces 203.

Figure 11:
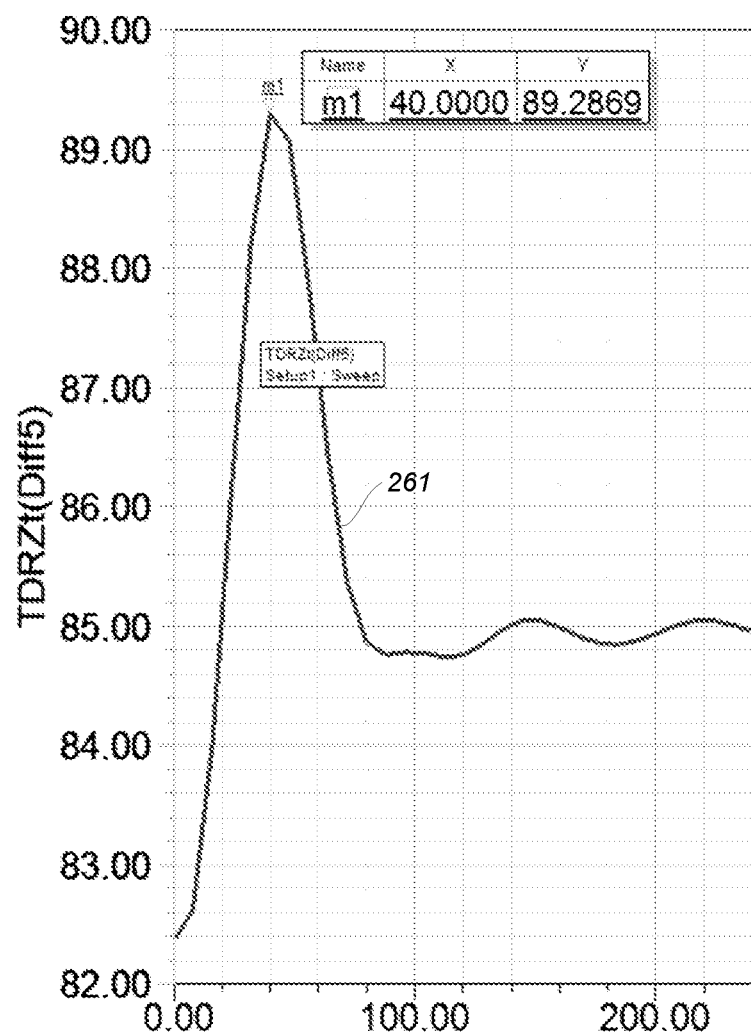
FIG. 11 is a graph of differential impedance in the third case study performed by the inventors.

FIG. 11 is a graph 261 of differential impedance in the third case study. The graph 261 indicates the differential impedance of differential signal traces 203 employed as contact fingers as in the connector 201C of FIG. 10. In the example of FIG. 11, the vertical axis indicates differential impedance in Ohms and the horizontal axis indicates time in picoseconds. As shown in FIG. 11, replacing the reference trace 204 with the reference plane 209 results in a differential impedance of about 89 Ohms, which is higher than the target impedance of 85 Ohms.

Figure 12:
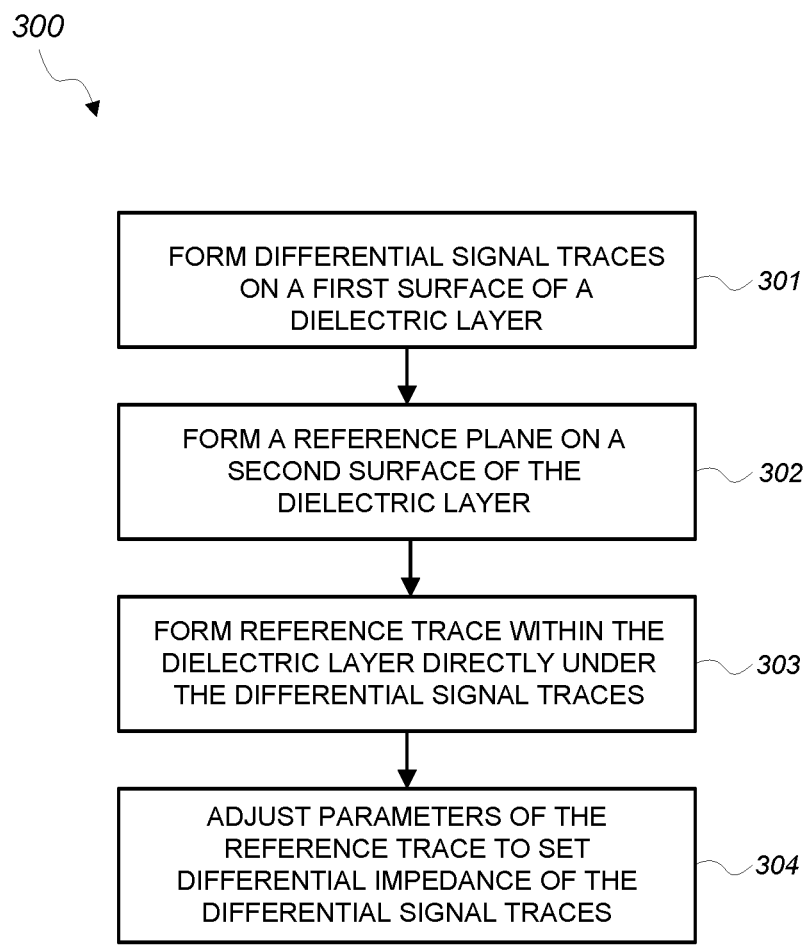
FIG. 12 is a flow diagram of a method of setting a differential impedance of differential signal traces in accordance with an embodiment of the present invention.

FIG. 12 is a flow diagram of a method 300 of setting a differential impedance of differential signal traces in accordance with an embodiment of the present invention. In the example of FIG. 12, the differential signal traces are adjacent signal traces that are formed on a first surface of a dielectric layer (step 301). The dielectric layer may be that of a PCB and the differential signal traces may be contact fingers on an edge connector of the PCB. A reference plane is formed on a second, opposing surface of the dielectric layer (step 302). A reference trace is formed within the dielectric layer (step 303), between the differential signal traces and the reference plane. Each of the reference trace, reference plane, and differential signal traces comprises a metal. The reference trace is positioned between the differential signal traces and may have dimensions that are constrained within outer perimeters of the signal traces.

One or more parameters of the reference trace are adjusted to set the differential impedance of the differential signal traces (step 304). The parameters of the reference trace include the thickness of the reference trace, the width of the reference trace, the distance of the reference trace relative to the differential signal traces, and the position of the reference trace within the dielectric layer. For example, parameters of the differential signal traces, the reference plane, and the dielectric layer may be fixed or have limited adjustability because of electrical or mechanical constraints imposed by a standard. In that example, one or more parameters of the reference trace are adjusted to set the differential impedance of the differential signal traces to meet a target impedance required by the standard, while holding the parameters of the dielectric layer, differential signal traces, and reference plane constant.

Figure 13:
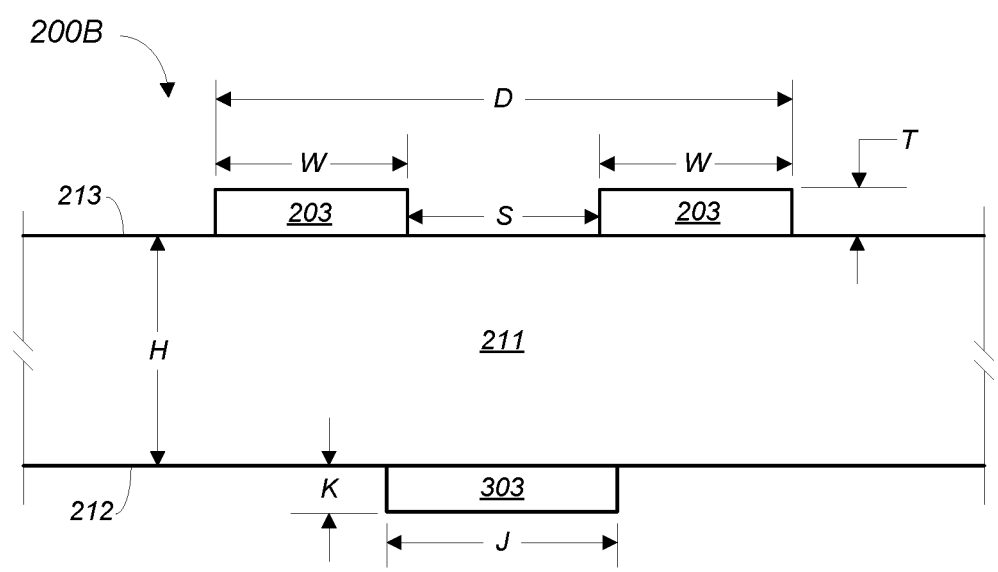
FIG. 13 is a cross-sectional view of a PCB in accordance with an embodiment of the present invention.

FIG. 13 is a cross-sectional view of a PCB 200B in accordance with an embodiment of the present invention. The PCB 200B is a particular embodiment of the PCB 200 shown in FIG. 4. The PCB 200B is the same as the PCB 200 but without a reference trace 204 within the dielectric layer 211 and without a reference plane 210 on the opposing surface 212 of the dielectric layer 211. Instead, the PCB 200B has a reference trace 303 that is formed on the surface 212 of the dielectric layer 211.

More particularly, the PCB 200B comprises the dielectric layer 211 and signal traces 203 as previously described. A reference trace 303, instead of a reference plane, is formed on the surface 212 of the dielectric layer 211. In the example of FIG. 13, the reference trace 303 is between the signal traces 203, has a thickness K, and has a width J that is narrower than the spanning distance D between outer side perimeters of the adjacent signal traces 203. The thickness K, width J, and the position of the reference trace 303 on the surface 212 may be adjusted to set the differential impedance of the signal traces 203.

Figure 14:
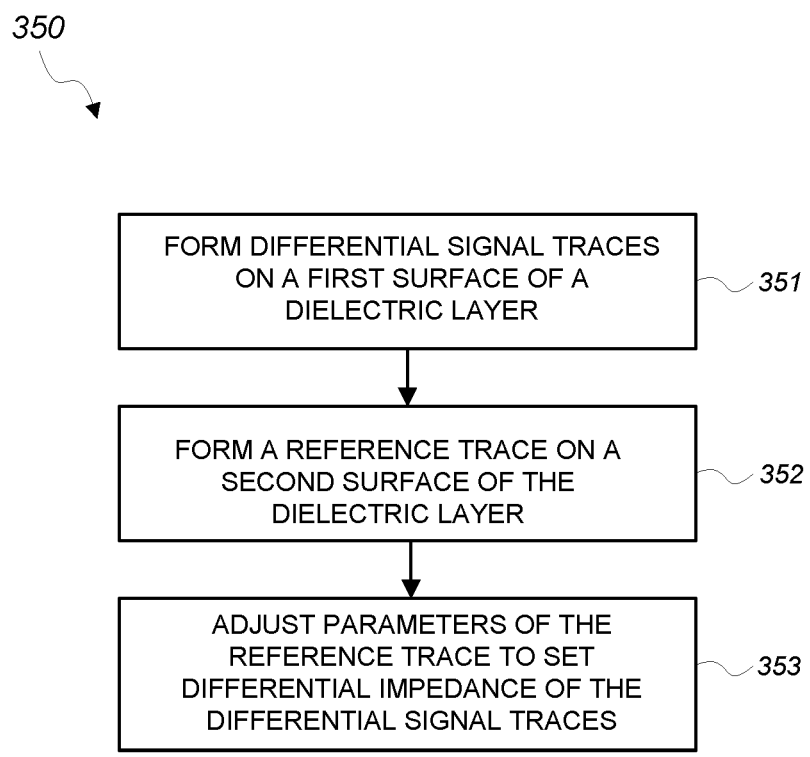
FIG. 14 is a flow diagram of a method of setting a differential impedance of differential signal traces in accordance with an embodiment of the present invention.

FIG. 14 is a flow diagram of a method 350 of setting a differential impedance of differential signal traces in accordance with an embodiment of the present invention. In the example of FIG. 14, the differential signal traces are adjacent signal traces that are formed on a first surface of a dielectric layer (step 351). The dielectric layer may be that of a PCB and the differential signal traces may be contact fingers of an edge connector of the PCB. A reference trace is formed on a second surface of the dielectric layer (step 352). The reference trace is positioned between the differential signal traces and may have dimensions that are constrained within outer parameters of the signal traces. Each of the reference trace and differential signal traces comprises a metal.

One or more parameters of the reference trace are adjusted to set the differential impedance of the differential signal traces (step 353). The parameters of the reference trace include the thickness of the reference trace, the width of the reference trace, and the position of the reference trace on the second surface of the dielectric layer. For example, parameters of the differential signal traces and the dielectric layer may be fixed or have limited adjustability because of electrical or mechanical constraints imposed by a standard. In that example, one or more parameters of the reference trace are adjusted to set the differential impedance of the differential signal traces to meet a target impedance required by the standard, while holding parameters of the dielectric layer and the differential signal traces constant.

Embodiments of the present invention have been described above in the context of differential signal traces. In light of the present disclosure, it can be appreciated that the present teachings can also be applied to a single-ended signal trace as now described beginning with FIG. 15.

Figure 15:
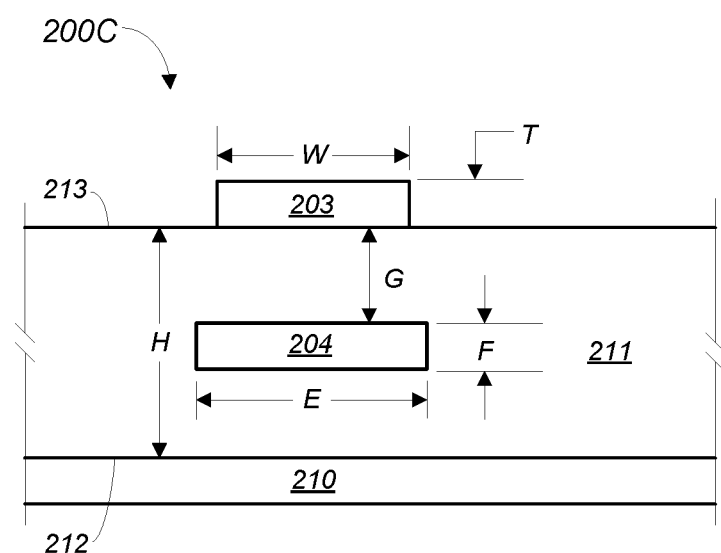
FIG. 15 is a cross-sectional view of a PCB in accordance with an embodiment of the present invention.

FIG. 15 is a cross-sectional view of a PCB 200C in accordance with an embodiment of the present invention. The PCB 200C is a particular embodiment of the PCB 200 shown in FIG. 4.

In the PCB 200C, the reference trace 204 is directly below a single-ended signal trace 203, i.e., a signal trace that is configured to propagate a single-ended signal. The signal trace 203 has a width W and a thickness T. The signal trace 203 is formed on a surface 213 of the dielectric layer 211, which has a thickness H. The reference trace 204 may have a width E that is narrower or wider than the width W of the signal trace 203.

One or more parameters of the reference trace 204 are adjusted to set the impedance of the signal trace 203 to meet a target impedance. For example, given constant/fixed or limited adjustability of the parameters of the signal trace 203, dielectric layer 211, and reference plane 210, the impedance of the signal trace 203 may be set to meet a target impedance by adjusting one or more parameters of the reference trace 204. The parameters of the reference trace 204 include a width E, thickness F, depth G between the reference trace 204 and the signal trace 203, and the position of the reference trace 204 within the dielectric layer 211. A method of setting an impedance of a single-ended signal trace 203 may be the same as the method 300 of FIG. 12, except that the signal trace is single-ended instead of differential.

Figure 16:
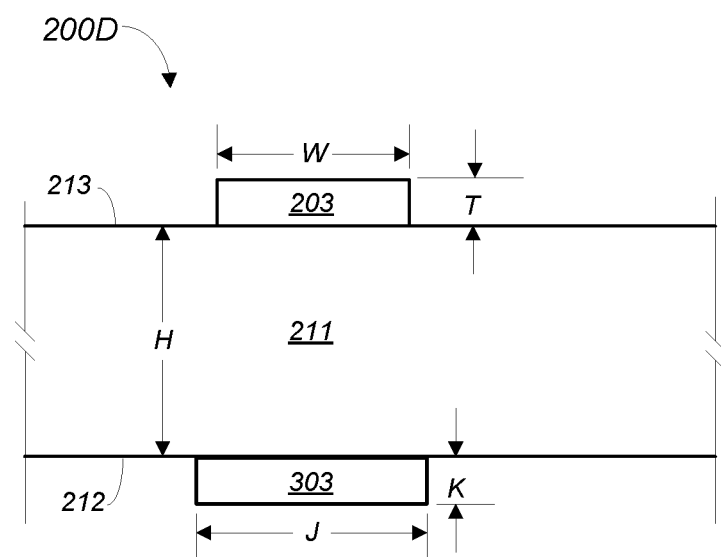
FIG. 16 is a cross-sectional view of a PCB in accordance with an embodiment of the present invention.

FIG. 16 is a cross-sectional view of a PCB 200D in accordance with an embodiment of the present invention. The PCB 200D is a particular embodiment of the PCB 200 shown in FIG. 4. The PCB 200D is the same as the PCB 200 but without a reference trace 204 within the dielectric layer 211, without a reference plane 210 on the opposing surface 212 of the dielectric layer 211, and with a single-ended signal trace 203 instead of differential signal traces. Similar to the PCB 200B of FIG. 13, the PCB 200D includes a reference trace 303 on the surface 212 of the dielectric layer 211.

More particularly, the PCB 200D comprises the dielectric layer 211 and a single-ended signal trace 203. The signal trace 203, which is formed on the surface 213 of the dielectric layer 211, has a width W and a thickness T. The dielectric layer 211 has a thickness H. A reference trace 303, instead of a reference plane, is formed on the surface 212 of the dielectric layer 211. In the example of FIG. 16, the reference trace 303 is directly under the signal trace 203, has a thickness K, and has a width J. The reference trace 303 may have a width J that is narrower or wider than the width W of the signal trace 203. The thickness K, width J, and the position of the reference trace 303 on the surface 212 of the dielectric layer 211 may be adjusted to set the impedance of the signal trace 203. A method of setting an impedance of a single-ended signal trace 203 may be the same as the method 350 of FIG. 14, except that the signal trace is single-ended instead of differential.

Circuit boards and methods of setting an impedance of signal traces have been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:

1. A circuit board comprising:
   a dielectric layer;
   a first signal trace and a second signal trace that are formed on a first surface of the dielectric layer on an edge connector of the circuit board;
   a reference plane formed on a second surface of the dielectric layer; and
   a reference trace formed within the dielectric layer and between the reference plane and the first and second signal traces, the reference trace being configured to set a differential impedance of the first and second signal traces,
   wherein the reference plane, the reference trace, the first signal trace, and the second signal trace each comprises a metal.

2. The circuit board of claim 1, wherein the differential impedance of the first and second signal traces is set to about 85 ohms.

3. The circuit board of claim 1, wherein the reference trace has a width that is narrower than a spanning distance between outer side perimeters of the first signal trace and the second signal trace.

4. The circuit board of claim 1, wherein the reference trace comprises copper.

5. The circuit board of claim 1, wherein the reference trace has a first portion that is in parallel with the first and second signal traces and a second portion that is perpendicular to the first portion.

6. The circuit board of claim 1, wherein the reference plane is between the dielectric layer and another layer of the circuit board.

7. The circuit board of claim 1, wherein the first signal trace and the second signal trace are contact fingers on the edge connector of the circuit board.

* * * * *